United States Patent [19]
Kojima et al.

[11] Patent Number: 5,542,114
[45] Date of Patent: Jul. 30, 1996

[54] RADIO RECEIVER FOR SUPPRESSING FREQUENCY DRIFT IN AN INTERMEDIATE FREQUENCY STAGE

[75] Inventors: Tatsuru Kojima, Tokyo; Isao Shimizu, Kanagawa, both of Japan

[73] Assignees: NEC Corporation; Nippon Telegraph and Telephone Corporation; NTT Mobile Communications Network, Inc., all of Tokyo, Japan

[21] Appl. No.: 487,586

[22] Filed: Jun. 7, 1995

Related U.S. Application Data

[63] Continuation of Ser. No. 905,316, Jun. 29, 1992, abandoned.

[30] Foreign Application Priority Data

Jun. 29, 1991 [JP] Japan .................................. 3-185232

[51] Int. Cl.⁶ .................................................. H04B 1/26
[52] U.S. Cl. ........................ 455/196.1; 455/258; 455/316
[58] Field of Search .......................... 455/196.1, 197.1, 455/255, 256, 258, 259, 265, 315, 316, 318, 209

[56] References Cited

U.S. PATENT DOCUMENTS

| | | | |
|---|---|---|---|
| 4,340,974 | 7/1982 | Cooke et al. | 455/258 |
| 4,512,035 | 4/1985 | Victor et al. | 455/316 |
| 4,817,195 | 3/1989 | Kubo et al. | 455/196.1 |
| 5,014,350 | 5/1991 | Nezu | 455/258 |
| 5,081,652 | 1/1992 | Farahati et al. | 455/256 |
| 5,101,509 | 3/1992 | Lai | 455/197.1 |
| 5,107,522 | 4/1992 | Kitayama et al. | 455/265 |

FOREIGN PATENT DOCUMENTS

| | | |
|---|---|---|
| 0253680 | 1/1988 | European Pat. Off. . |
| 0412207 | 2/1991 | European Pat. Off. . |

*Primary Examiner*—Edward F. Urban
*Attorney, Agent, or Firm*—Foley & Lardner

[57] ABSTRACT

In a radio receiver for receiving a radio signal, a counter (32) counts an eventual intermediate frequency of an amplified signal based on a reference signal as a count datum. A frequency controller (27) controls a reference frequency of the reference signal according to the count datum. A reference oscillator (25) is controlled by the frequency controller to produce the reference signal. Receiving a radio signal by double superheterodyne, the radio receiver gives the eventual intermediate frequency to the amplified signal. In the amplified signal, the frequency controller suppresses an eventual frequency drift which results from frequency drifts of a first local oscillation and a second local oscillation. The radio receiver may be a single superheterodyne receiver.

3 Claims, 4 Drawing Sheets

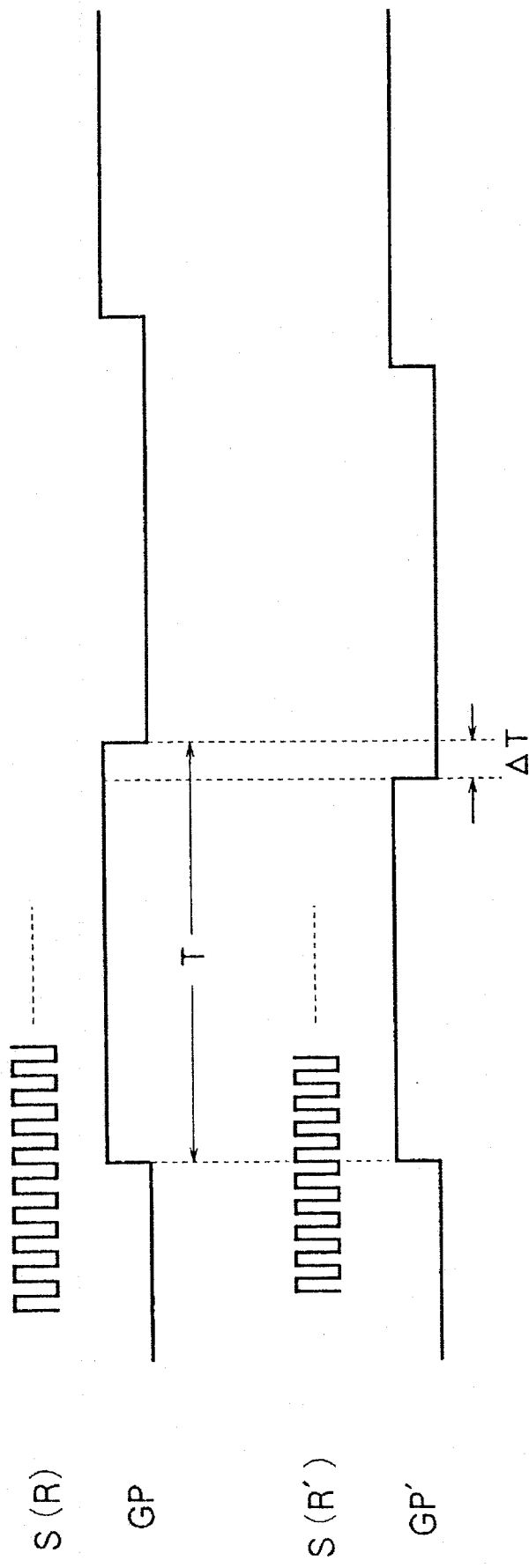

RADIO RECEIVER FOR SUPPRESSING FREQUENCY DRIFT IN AN INTERMEDIATE FREQUENCY STAGE

This application is a continuation of application Ser. No. 07/905,316, filed Jun. 29, 1992, now abandoned.

BACKGROUND OF THE INVENTION

This invention relates to a radio receiver, such as a super heterodyne receiver, for receiving a radio signal.

A conventional radio receiver includes a receiving section for receiving the radio signal and for producing a received signal. In the manner known in the art, the radio signal carries one or more baseband signals. A reference oscillator is for producing a reference signal having a reference frequency. An oscillation producing section is connected to the reference oscillator for producing a local signal according to the reference signal. In other words, the local signal is related to the reference signal as regards their frequencies. A mixing section is connected to the receiving section and the oscillation producing section for mixing the received signal with the local signal to produce an IF signal having an intermediate frequency. A demodulator demodulates the IF signal into the baseband signal or signals.

The radio receiver may be a double super heterodyne receiver. In this event, the oscillation producing section comprises first and second local oscillators. The first local oscillator produces a first local signal which is related to the reference signal as regards their frequencies. The second local oscillator produces a second local signal which is not related to the reference signal in frequency. The mixing section comprises first and second mixing units. The first mixing unit is connected to the receiving section and the first local oscillator for mixing the received signal with the first local signal to produce a first IF signal. The second mixing unit is connected to the first mixing unit and the second local oscillator for mixing the first IF signal with the second local signal to produce a second IF signal having an eventual frequency which corresponds to the above-mentioned intermediate frequency.

As will later be described more in detail, the conventional radio receiver is defective in that the intermediate frequency or the eventual frequency has a frequency drift.

SUMMARY OF THE INVENTION

It is therefore an object of the present invention to provide a radio receiver capable of suppressing a frequency drift in an intermediate frequency when the radio receiver is a single super heterodyne receiver.

It is another object of this invention to provide a radio receiver capable of suppressing a frequency drift in an eventual frequency of an intermediate signal when the radio receiver is a double super heterodyne receiver.

Other objects of this invention will become clear as the description proceeds.

On describing the gist of this invention, it is possible to understand that a radio receiver is for receiving a radio signal and comprises receiving means for receiving the radio signal and for producing a received signal, a reference oscillator for producing a reference signal having a reference frequency, oscillation producing means connected to the reference oscillator for producing a local signal according to the reference signal, mixing means connected to the receiving means and the oscillation producing means for mixing the received signal with the local signal to produce an IF signal having an eventual intermediate frequency.

According to this invention, the above-understood radio receiver comprises a frequency counter connected to the mixing means and the reference oscillator for counting the eventual intermediate frequency based on the reference signal and for producing a frequency count signal representative of the eventual intermediate frequency, and controlling means connected to the frequency counter and the reference oscillator for controlling the reference frequency according to the frequency count signal.

BRIEF DESCRIPTION OF THE DRAWING

FIG. 4 is a time chart for use in describing operation of a frequency counter of the radio receiver illustrated in FIG. 3.

DESCRIPTION OF THE PREFERRED EMBODIMENT

Figure 1:
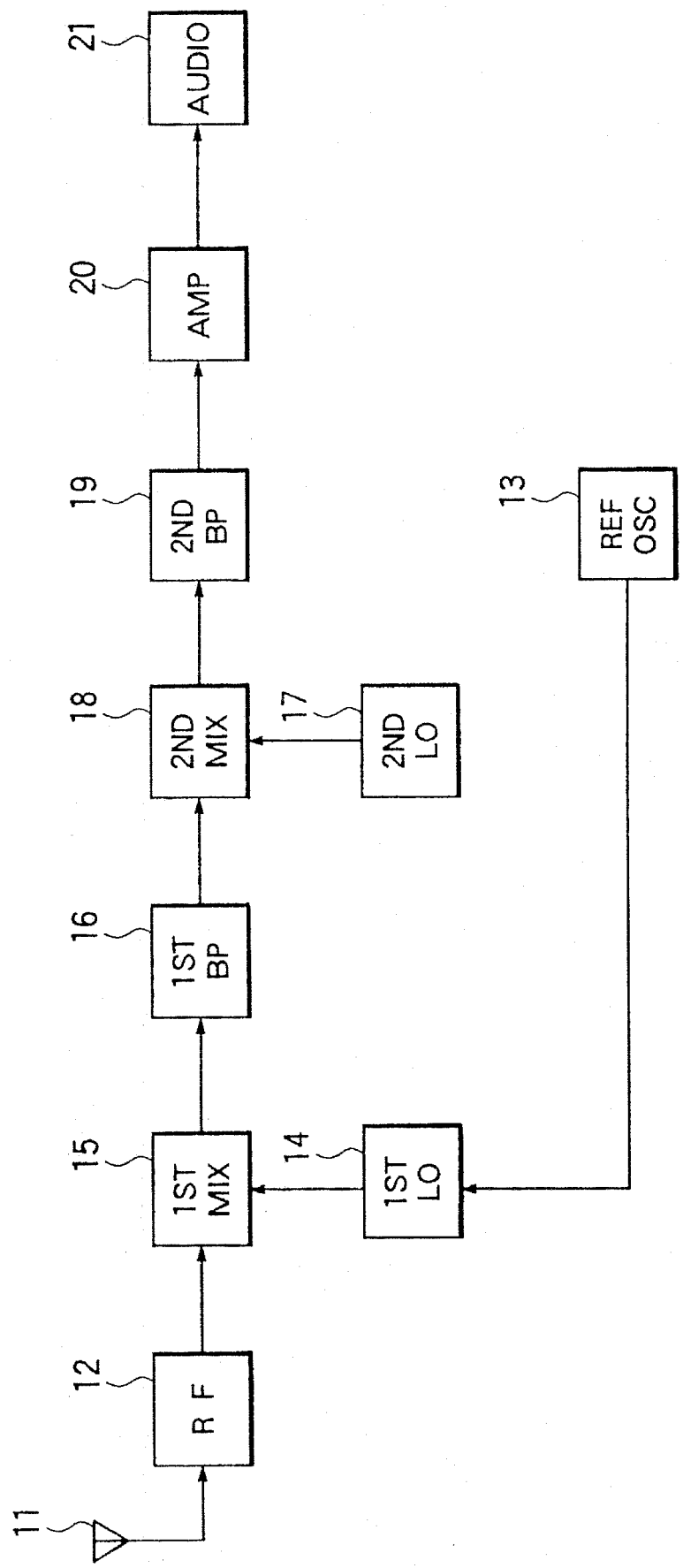
FIG. 1 is a block diagram of a conventional radio receiver.

Referring to FIG. 1, a conventional radio receiver will first be described in order to facilitate an understanding of the present invention. The radio receiver is provided for receiving a radio signal which carries one or more baseband signals.

In FIG. 1, the radio receiver is a double super heterodyne receiver for use typically as an ordinary radio receiver, a mobile telephone set, or a portable telephone set. The illustrated radio receiver comprises an antenna 11 for receiving the radio signal and for producing a received signal. A radio frequency amplifier (RF) 12 is connected to the antenna 11 for amplifying the received signal. A reference oscillator (REF OSC) 13 produces a reference signal having a reference frequency.

A first local oscillator (1st LO) 14 is connected to the reference oscillator 13 to produce a first local signal having a predetermined relationship with the reference frequency. A first mixer (1st MIX) 15 is connected to the radio frequency amplifier 12 and the first local oscillator 14 for mixing the received signal with the first local signal to produce a first IF signal. A first band-pass filter (1st BP) 16 is connected to the first mixer 15 for filtering the first IF signal.

A second local oscillator (2nd LO) 17 produces a second local signal having an original frequency. A second mixer (2nd MIX) 18 is connected to the first band-pass filter 16 and the second local oscillator 14 for mixing the first IF signal with the second local signal to produce a second IF signal having an eventual intermediate frequency. A second band-pass filter (2nd BP) 19 is connected to the second mixer 18 for filtering the second IF signal.

An amplifier (AMP) 20 is connected to the second band-pass filter 19 for amplifying the second IF signal. An audio section (AUDIO) 21 is connected to the amplifier 20 for demodulating the second IF signal into the baseband signal or signals.

The reference oscillator 13 is a temperature-compensated crystal oscillator. The reference oscillator 13 and the first local oscillator 14 are collectively operable as a phase locked loop synthesizer.

Generally, an oscillator generates an oscillator output signal of a frequency which is inevitably subjected to a frequency drift. The reference frequency of the reference oscillator 13 will be represented by $f_R+f_R$, where $f_R$ represents a nominal frequency of the reference oscillator 13 and $\Delta f_R$ represents the frequency drift of the reference oscillator 13. The frequency drift of the temperature-compensated crystal oscillator is equal to 1.5–2.5 ppm of the nominal frequency.

If the reference signal has the nominal frequency $f_R$ without the frequency drift, the first local signal has a predetermined frequency which will be represented by $f_{1L}$. When the reference signal has the reference frequency $f_R+\Delta f_R$ with the frequency drift, the first local signal has a drifting frequency which will be represented by $f_{1L}+\Delta f_{1L}$, where $\Delta f_{1L}$ represents a frequency drift in the first local signal and is equal to $f_{1L}*\Delta f_R/f_R$.

The first IF signal has a first intermediate frequency which will be represented by $f_1-\Delta f_1$, where $f_1$ is a first nominal intermediate frequency and $\Delta f_1$ is a first intermediate frequency drift of the first mixer 15. If the received signal has a received frequency having no frequency drift, the first intermediate frequency drift $\Delta f_1$ is equal to the frequency drift $\Delta f_{1L}$ of the first local signal.

The second local oscillator 17 is a crystal oscillator which is not temperature-compensated and will be called a general crystal oscillator. The original frequency of the second local oscillator 17 will be represented by $f_{2L}+\Delta f_{2L}$, where $f_{2L}$ represents a titular frequency of the second local oscillator 17 and $\Delta f_{2L}$ represents a frequency drift of the second local oscillator 17. The general crystal oscillator has a frequency drift which is equal to about 10 ppm of the titular frequency.

The eventual intermediate frequency will be represented by $f_2-\Delta f_2$, where $f_2$ is a second nominal intermediate frequency and $\Delta f_2$ is a second intermediate frequency drift of the second mixer 18. The second intermediate frequency drift $\Delta f_2$ is a sum of the first intermediate frequency drift $\Delta f_1$ and the frequency drift $\Delta f_{2L}$ of the second local oscillator 17. When the received signal has the received frequency having no frequency drift, the first intermediate frequency drift $\Delta f_1$ is equal to the frequency drift $\Delta f_{1L}$ in the first local signal as described above. The second intermediate frequency drift $\Delta f_2$ is therefore represented by $\Delta f_{1L}+\Delta f_{2L}$.

It is a tendency that band widths of radio signals are rendered narrower. The frequency drift of the eventual intermediate frequency must be small. However, it is difficult to reduce the frequency drift of a crystal oscillator. In other words, a crystal oscillator with a small frequency drift gives a low yield. The frequency drift may be reduced by combining a crystal oscillator with a temperature-compensating circuit. This, however, renders the crystal oscillator bulky. Even with the temperature-compensating circuit, the frequency drift unavoidably appears with a lapse of time.

Figure 2:
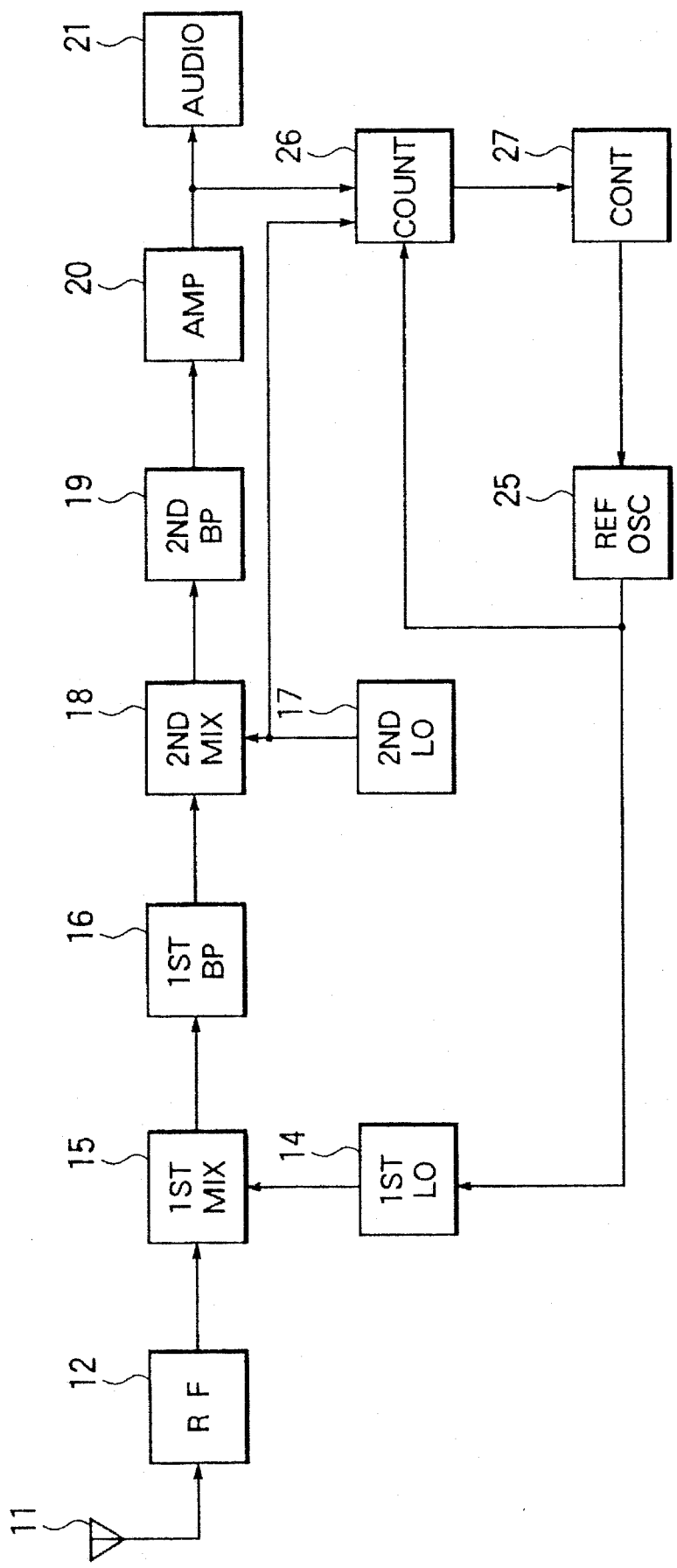
FIG. 2 is a block diagram of another conventional radio receiver.

A different conventional radio receiver is illustrated in FIG. 2. Such a radio receiver is described in Japanese Patent Publication No. 63-26020.

In FIG. 2, the radio receiver comprises an antenna 11 for receiving a radio signal and for producing a received signal. The radio signal carries one or more baseband signals. A radio frequency amplifier (RF) 12 is connected to the antenna 11 for amplifying the received signal. A reference oscillator (REF OSC) 25 produces a reference signal having a reference frequency. The reference oscillator 25 is designated by a new reference numeral because the reference oscillator 25 is different from that described in conjunction with FIG. 1 in the manner which will presently become clear.

A first local oscillator (1st LO) 14 is connected to the reference oscillator 25 to produce a first local signal having a predetermined relationship with the reference frequency. A first mixer (1st MIX) 15 is connected to the radio frequency amplifier 12 and the first local oscillator 14 for mixing the received signal with the first local signal to produce a first IF signal. A first band-pass filter (1st BP) 16 is connected to the first mixer 15 for filtering the first IF signal.

A second local oscillator (2nd LO) 17 produces a second local signal having an intermediate frequency, which will be called an original frequency. A second mixer (2nd MIX) 18 is connected to the first band-pass filter 16 and the second local oscillator 14 for mixing the first IF signal with the second local signal and to produce a second IF signal having an eventual intermediate frequency. A second band-pass filer (2nd BP) 19 is connected to the second mixer 18 for filtering the second IF signal.

An amplifier (AMP) 20 is connected to the second band-pass filter 19 for amplifying the second IF signal. An audio section (AUDIO) 21 is connected to the amplifier 20 for demodulating the second IF signal into the baseband signal or signals.

A frequency counter (COUNT) 26 is connected to the reference oscillator 25, the second local oscillator 17, and the amplifier 20 for counting the original frequency of the second local oscillator 17 and the eventual intermediate frequency of the second mixer 18 based on the reference signal to produce a frequency count signal representative of a sum of the original frequency and the eventual frequency as a count datum. A frequency controller (CONT) 27 is connected to the frequency counter 26 and the reference oscillator 25. Supplied with the count datum, the frequency controller 27 controls the reference frequency.

Like the first IF signal described in connection with FIG. 1, the first IF signal has a first intermediate frequency having a first nominal intermediate frequency and a first nominal intermediate frequency drift. The sum of the original frequency and the eventual frequency is equal to the first intermediate frequency.

A signal representative of the first nominal intermediate frequency is preliminarily supplied to the controller 27 as a predetermined datum. The controller 27 compares the count datum with the predetermined datum. The controller 27 controls the reference frequency so as to make the count datum coincide with the predetermined datum.

In this radio receiver, it is possible to suppress the first nominal intermediate frequency drift in the eventual intermediate frequency. However, it is impossible to suppress a frequency drift in the original frequency of the second local oscillator 17. The eventual frequency has the frequency drift in the original frequency.

Figure 3:
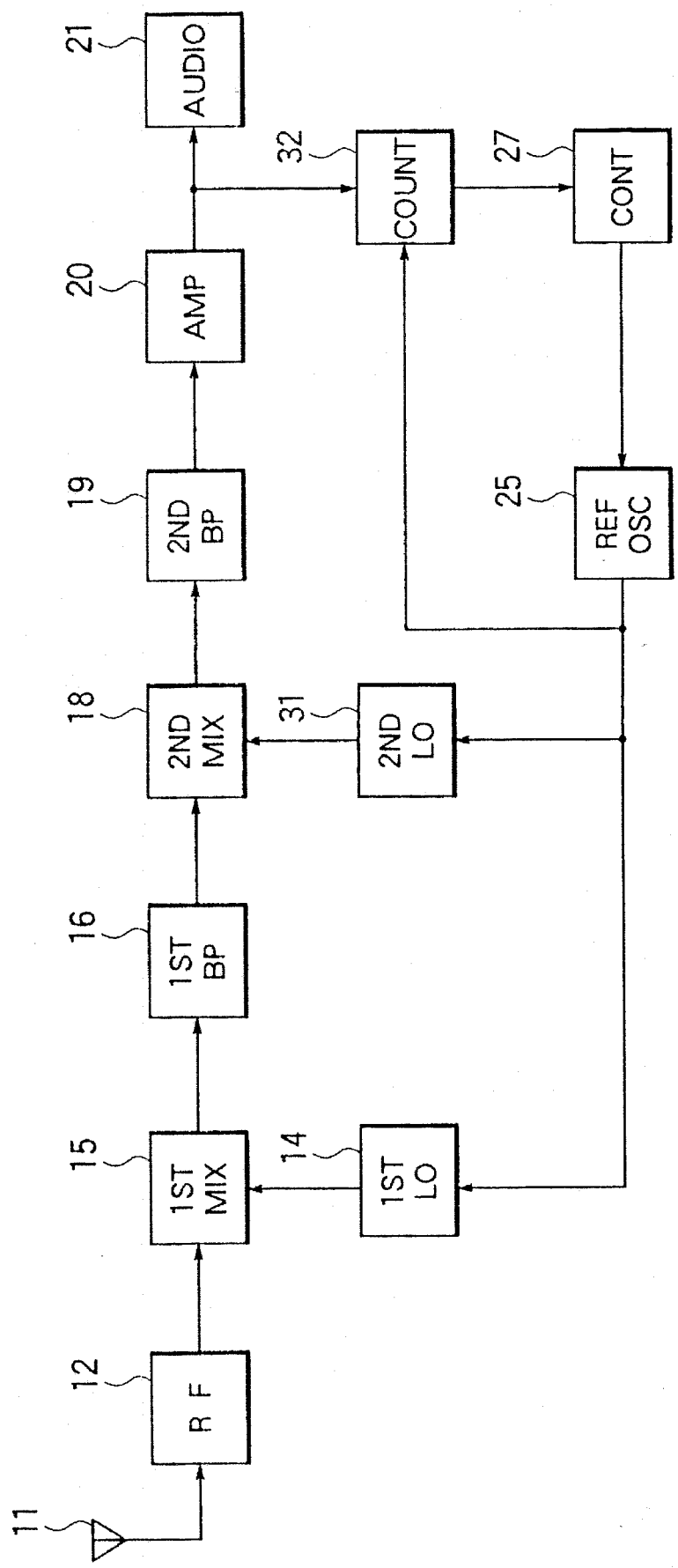
FIG. 3 is a block diagram of a radio receiver according to an embodiment of this invention.

Referring to FIG. 3, the description will proceed to a radio receiver according to a preferred embodiment of this invention.

This radio receiver is for receiving a radio signal carrying one or more baseband signals. The radio receiver comprises an antenna 11 for receiving the radio signal to produce a received signal. A radio frequency amplifier (RF) 12 is connected to the antenna 11 for amplifying the received signal. Like in FIG. 2, a reference oscillator (REF OSC) 25 produces a reference signal S(R) having a reference frequency.

A first local oscillator (1st LO) 14 is connected to the reference oscillator 25 for producing a first local signal having a first intermediate frequency which has a first predetermined relationship with the reference frequency. A first mixer (1st MIX) 15 is connected to the radio frequency amplifier 12 and the first local oscillator 14 for mixing the received signal with the first local signal to produce a first IF signal. A first band-pass filter (1st BP) 16 is connected to the first mixer 15 for filtering the first IF signal.

The radio receiver comprises a second local oscillator (2nd LO) 31. In contrast to the second local oscillator 17 described in conjunction with FIGS. 1 or 2, the second local oscillator 31 is connected to the reference oscillator 25 and is therefore designated by a different reference numeral. The second local oscillator 31 is for producing a second local signal having a second predetermined relationship with the reference frequency.

A second mixer (2nd MIX) 18 is connected to the first band-pass filter 16 and the second local oscillator 31 for mixing the first IF signal with the second local signal to produce a second IF signal having an eventual intermediate frequency. A second band-pass filter (2nd BP) 19 is connected to the second mixer 18 for filtering the second IF signal.

An amplifier (AMP) 20 is connected to the second band-pass filter 19 for amplifying the second IF signal. The amplifier 20 produces an amplified signal with the eventual frequency. An audio section (AUDIO) 21 is connected to the amplifier 20 for demodulating the second IF signal into the baseband signal or signals.

A frequency counter 32 is connected to the amplifier 20 and the reference oscillator 25 for counting the eventual frequency of the amplifier signal as a count datum based on the reference signal to produce a counted frequency signal representative of the count datum. The counted frequency signal represents a counted eventual intermediate frequency. More particularly, a count interval T is determined by the reference frequency. The frequency counter 32 counts the eventual frequency in each count interval. A frequency controller (CONT) 27 is connected to the frequency counter 32 and the reference oscillator 25. Supplied with the count datum, the frequency controller 27 controls the reference frequency. It should be noted in this connection that the frequency controller 27 of FIG. 2 controls the reference frequency in compliance with the first IF signal. In marked contrast, the frequency controller 27 of FIG. 3 controls the reference frequency by the eventual frequency of the amplified signal, namely, of the second local IF signal.

The reference oscillator 25 and the first local oscillator 14 are collectively operable as a phase locked loop synthesizer. The reference oscillator 25 and the second local oscillator are collectively operable as another phase locked loop synthesizer.

The reference frequency of the reference oscillator 25 will be represented by $f_R + \Delta f_R$, where $f_R$ represents a nominal frequency of the reference signal and $\Delta f_R$ represents a frequency drift of the reference frequency.

When the reference signal has the reference frequency $f_R + \Delta f_R$ with the frequency drift, the first local signal has a first drifting frequency which will be represented by $f_{1L} + \Delta f_{1L}$, where $f_{1L}$ represents a first predetermined frequency and $\Delta f_{1L}$ represents a first frequency drift in the first local signal. The first frequency drift $\Delta f_{1L}$ is equal to $f_{1L}*\Delta f_R/f_R$. The second local signal has a second drifting frequency consisting of a second predetermined frequency $f_{2L}$ and a second frequency drift $\Delta f_{2L}$ in the second predetermined frequency. The second frequency drift $\Delta f_{2L}$ is equal to $f_{2L}*\Delta f_R/f_R$.

The first IF signal has a first intermediate frequency which will be represented by $f_1 - \Delta f_1$, where $f_1$ is a first nominal intermediate frequency and $\Delta f_1$ is a first intermediate frequency drift of the first mixer 15. If the received signal has a received frequency having no frequency drift, the first intermediate frequency drift $\Delta f_1$ is equal to the first intermediate frequency drift $\Delta f_{1L}$.

The second IF signal has the intermediate frequency as a second intermediate frequency which will be represented by $f_2 - \Delta f_2$, where $f_2$ is a second nominal intermediate frequency and $\Delta f_2$ is a second intermediate frequency drift of the eventual frequency. When the received signal has a received frequency having no frequency drift, the second intermediate frequency drift $\Delta f_2$ is represented by $\Delta f_{1L} + \Delta f_{2L}$. It should be noted that the received frequency should be higher than the first predetermined frequency $f_{1L}$ and that the first predetermined frequency $f_{1L}$ should be higher than the second predetermined frequency $f_{2L}$.

The frequency counter 32 periodically produces at the count interval a gate pulse sequence GP for gating the amplified signal. Each gate pulse has a duration which is equal to the count interval T.

Turning to FIG. 4, the reference signal S(R) with no frequency drift is depicted along a first or top row labelled S(R). The gate pulse sequence GP is illustrated along a second row when the reference signal has no frequency drift and when the amplified signal has no frequency drift. In this event, each gate pulse of the gate pulse sequence has a normal duration which is equal to the count interval T.

The reference signal having the frequency drift is depicted along a third row labelled S(R'). The gate pulse sequence is produced in this event in this manner depicted along a fourth or bottom low labelled GP'. Each gate pulse has a drifting duration which is shorter by a time difference or gap $\Delta t$ than the normal duration T, if the frequency drift has a positive sign. The time difference $\Delta t$ is equal to $\Delta f_R/(f_R+\Delta f_R)$. Due to the time difference $\Delta T$, the frequency counter 32 can not count the eventual frequency correctly. However, it is possible to disregard the time difference $\Delta T$, because the time difference $\Delta T$ is very small.

The frequency counter 32 produces a frequency count signal representative of the counted eventual intermediate frequency as a count datum. The counted eventual intermediate frequency is represented by $f_2'$. The counted eventual intermediate frequency $f_2'$ is equal to $(f_2-\Delta f_2)*f_R/(f_R+\Delta f_R)$.

A signal representative of the second nominal intermediate frequency $f_2$ is preliminarily supplied to the frequency controller 27 and is stored in the frequency controller 27 as a predetermined datum. The frequency controller 27 takes or subtracts the counted eventual intermediate frequency $f_2'$ from the second nominal intermediate frequency $f_2$ to produce an eventual frequency drift $\Delta f_2'$ of the amplified signal as follows.

$$\begin{aligned}
\Delta f_2' &= f_2 - f_2' \\
&= f_2 - (f_2 - \Delta f_2)*f_R/(f_R + \Delta f_R) \\
&= (f_2*(f_R + \Delta f_R) - (f_2 - \Delta f_2)*f_R)/(f_R + \Delta f_R) \\
&= (f_2*\Delta f_R + \Delta f_2*f_R)/(f_R + \Delta f_R) \\
&= (f_2*\Delta f_R + (\Delta f_{1L} + \Delta f_{2L})*f_R)/(f_R + \Delta f_R) \\
&= (f_2*\Delta f_R + (f_{1L}*\Delta f_R/f_R + f_{2L}*\Delta f_R/f_R)*f_R)/(f_R + \Delta f_R) \\
&= (f_2*\Delta f_R + f_{1L}*\Delta f_R + f_{2L}*\Delta f_R)/(f_R + \Delta f_R) \\
&= (f_2 + f_{1L} + f_{2L})*\Delta f_R/(f_R + \Delta f_R) \\
&= F_R*\Delta f_R/(f_R + \Delta f_R)
\end{aligned}$$

where, $F_R$ represents the received frequency and is equal to $f_2+f_{1L}+f_{2L}$. The remainder depends on the frequency drift $\Delta f_R$ in the reference signal. The frequency controller 27 controls the reference frequency so as to reduce the frequency drift $\Delta f_R$. In practice, the frequency controller 27 changes the nominal frequency $f_R$ to a new nominal frequency which is represented by $f_R'$, when the eventual frequency drift $\Delta f_2'$ is not equal to zero. The reference frequency has a new reference frequency which is represented by $f_R'+\Delta f_R'$. The new reference frequency $f_R'+\Delta f_R'$ is equal to the nominal frequency $f_R$. It seems that the reference signal has the nominal frequency $f_R$ without the frequency drift $\Delta f_R$.

This radio receiver can suppress the frequency drift in the amplified signal because the frequency controller 27 controls the reference frequency by the eventual frequency of the amplified signal.

While this invention is described in conjunction with a double super heterodyne referring to the drawing, it will readily be possible to put this invention into a single super heterodyne receiver.

What is claimed is:

1. A radio receiver for receiving a radio signal to produce an eventual intermediate frequency (IF) signal having a predetermined frequency and being substantially free from a frequency drift, said radio receiver comprising:

receiving means for receiving said radio signal to produce a received signal;

a controllable reference oscillator supplied with a control signal for oscillating a reference signal having a reference frequency on the basis of said control signal;

a first local oscillator connected to said reference oscillator for producing a first local signal controlled by said reference signal;

first mixing means connected to said receiving means and said first local oscillator for mixing said received radio signal with said first local signal into a first IF signal having a first frequency;

a second local oscillator connected to said reference oscillator for producing a second local signal controlled by said reference signal;

second mixing means connected to said first mixing means and said first local oscillator for mixing said first IF signal with said second local signal to produce, as said eventual IF signal, a second IF signal having a second frequency different from said first frequency;

a frequency counter connected to said second mixing means and said reference oscillator and disconnected from said second local oscillator for counting said second IF signal during a time period varied based upon a variation of the reference frequency to produce a frequency count signal which indicates said second frequency of said second IF signal and which lasts for said time period; and control signal supplying means connected to said frequency counter and said reference oscillator for supplying, as said control signal, a reference control signal according to said frequency count signal to said reference oscillator for adjusting said second frequency to said predetermined frequency which is substantially free from said frequency drift.

2. A radio receiver as recited in claim 1, wherein said control signal supplying means comprises means for comparing a nominal value of said second frequency with said frequency count signal to determine said reference control signal.

3. A method of suppressing frequency drift in a radio receiver to produce an eventual intermediate frequency (IF) signal having a predetermined frequency and being substantially free from the frequency drift, the method comprising the steps of:

receiving a radio signal and producing a received signal;

supplying an oscillating reference signal having an adjustable reference frequency from a reference oscillator supplied with a control signal to a first and second local oscillator;

producing a first local signal in said first local oscillator determined by said reference signal;

mixing said received signal with said first local signal in a first mixer into a first IF signal having a first frequency;

producing a second local signal in said second local oscillator determined by said reference signal;

mixing said first IF signal with said second local signal in a second mixer to produce, as said eventual IF signal, a second IF signal having a second frequency and being different from said first frequency;

counting, in a frequency counter connected to said second mixer and said reference oscillator and disconnected from said second local oscillator, said second IF signal during a time period varied based upon variations in the reference frequency and producing a frequency count signal which indicates said second frequency of said second IF signal and which lasts for said time period;

comparing a nominal value of said second frequency to said frequency count signal to determine a reference control signal;

supplying said reference control signal, as said control signal, to said reference oscillator; and adjusting said second frequency to said predetermined frequency which is substantially free from said frequency drift.

* * * * *